(12) United States Patent
Bhattacharya et al.

(10) Patent No.: US 9,362,719 B2
(45) Date of Patent: Jun. 7, 2016

(54) GAN-BASED QUANTUM DOT VISIBLE LASER

(71) Applicant: THE REGENTS OF THE UNIVERSITY OF MICHIGAN, Ann Arbor, MI (US)

(72) Inventors: Pallab Bhattacharya, Ann Arbor, MI (US); Meng Zhang, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 13/721,930

(22) Filed: Dec. 20, 2012

(65) Prior Publication Data
US 2013/0259079 A1    Oct. 3, 2013

Related U.S. Application Data

(60) Provisional application No. 61/618,146, filed on Mar. 30, 2012.

(51) Int. Cl.
H01S 5/343 (2006.01)
H01S 5/30 (2006.01)
H01S 5/34 (2006.01)
B82Y 20/00 (2011.01)
B82Y 40/00 (2011.01)
(Continued)

(52) U.S. Cl.
CPC ............... *H01S 5/3013* (2013.01); *B82Y 20/00* (2013.01); *H01S 5/3412* (2013.01); *B82Y 40/00* (2013.01); *H01S 5/0203* (2013.01); *H01S 5/028* (2013.01); *H01S 5/2009* (2013.01); *H01S 5/3211* (2013.01); *H01S 5/34333* (2013.01); *H01S 2304/02* (2013.01); *Y10S 977/774* (2013.01)

(58) Field of Classification Search
CPC ..... H01S 5/023; H01S 5/0287; H01S 5/3412; H01S 5/3433
USPC .......................................... 372/45.01, 49.01
See application file for complete search history.

(56) References Cited

U.S. PATENT DOCUMENTS 5,559,822 A    9/1996  Pankove et al.
6,345,063 B1   2/2002  Bour et al.
(Continued)

FOREIGN PATENT DOCUMENTS

KR    20050019484 A    3/2005

OTHER PUBLICATIONS

Avramescu et al., 47.3: Invited Paper: Recent progress in direct green lasers for mobile image projectors, SID Symposium Digest of Technical Papers, 42(1):685-8 (2011).
(Continued)

*Primary Examiner* — Yuanda Zhang
*Assistant Examiner* — Michael Carter
(74) *Attorney, Agent, or Firm* — Marshall, Gerstein & Borun LLP (57) ABSTRACT

A III-nitride based quantum dot (QD) laser is formed of InGaN/GaN quantum dots and capable emitting at a single wavelength within the visible region, including the violet wavelength region (400-440 nm), the blue wavelength region (440-490 nm), the green wavelength region (490-570 nm), the yellow wavelength region (570-590 nm), the orange wavelength region (590-620 nm), and the red wavelength region (620-700 nm), with varying composition as described.

33 Claims, 10 Drawing Sheets

(51) Int. Cl.
*H01S 5/02* (2006.01)
*H01S 5/028* (2006.01)
*H01S 5/20* (2006.01)
*H01S 5/32* (2006.01)

(56) References Cited

U.S. PATENT DOCUMENTS

| | | | |
|---|---|---|---|
| 6,816,525 | B2 | 11/2004 | Stintz et al. |
| 8,053,972 | B2 | 11/2011 | Bawendi et al. |
| 2002/0114367 | A1 | 8/2002 | Stintz et al. |
| 2004/0009681 | A1* | 1/2004 | Fafard .......................... 438/962 |
| 2004/0131097 | A1 | 7/2004 | Deppe et al. |
| 2004/0183063 | A1 | 9/2004 | Nakamura et al. |
| 2007/0201522 | A1 | 8/2007 | Huffaker et al. |
| 2007/0272915 | A1* | 11/2007 | Nakamura et al. .............. 257/14 |
| 2008/0172197 | A1 | 7/2008 | Skipor et al. |
| 2009/0179191 | A1* | 7/2009 | Smith et al. ..................... 257/13 |
| 2009/0256165 | A1* | 10/2009 | Smith et al. ..................... 257/94 |
| 2010/0226400 | A1* | 9/2010 | Sauer et al. ................. 372/43.01 |
| 2010/0283072 | A1 | 11/2010 | Kazlas et al. |

OTHER PUBLICATIONS

Avramescu et al., True Green Laser Diodes at 524 nm with 50 mW Continuous Wave Output Power on C-Plane GaN, Appl. Phys. Exp., 3:061003 (2010).
Bhattacharya et al., Tunnel injection $In_{0.25}Ga_{0.75}N$/GaN quantum dot light-emitting diodes, Appl. Phys. Lett., 97:251107 (2010).
Cho et al., Effect of growth interruptions on the light emission and indium clustering of InGaN/GaN multiple quantum wells, Appl. Phys. Lett., 79:2594 (2001).
Gerhard et al., Short wavelength emission of AlGaInP quantum dots grown on GaP substrate, Nanotechnology, 22(41):415604 (2011).
Kitagawa et al., Green GaInN photonic-crystal light-emitting diodes with small surface recombination effect, Appl. Phys. Lett, 98:181104 (2011).
Ohta et al., Future of group-III nitride semiconductor green laser diodes [Invited], Josa B, 27(11):B45-9 (2010).
"QD Laser Unveils World's First Quantum Dot Pure Green Laser Source Model", press release, QD Laser, Inc. (Sep. 29, 2009).
Schulz et al., Built-in field reduction in InGaN/GaN quantum dot molecules, Appl. Phys. Lett., 99(22):223106 (2011).
Schulz et al., Theory of reduced built-in polarization field in nitride-based quantum dots, Phys. Rev. B, 82:033411 (2010).
Tachibana et al., Growth of InGaN self-assembled quantum dots and their application to lasers, IEEE J. Selected Topics in Quantum Electronics, 6(3):475-81 (2000).
Wu et al., Electronic and optical properties of InGaN quantum dot based light emitters for solid state lighting, J. Appl. Phys., 105:013117 (2009).
Wu et al., Stacking fault formation in the long wavelength InGaN/GaN multiple quantum wells grown on m-plane GaN, Appl. Phys. Lett., 96:231912 (2010).
Zhang et al., InGaN/GaN self-organized quantum dot green light emitting diodes with reduced efficiency droop, Appl. Phys. Lett., 97:011103 (2010).

Zhang et al., Mg doping of GaN grown by plasma-assisted molecular beam epitaxy under nitrogen-rich conditions, Appl. Phys. Lett., 96:132103 (2010).
Zhao et al., Optical gain analysis of strain-compensated InGaN—AlGaN quantum well active regions for lasers emitting at 420-500 nm, Optical and Quantum Electronics, 40(5-6):301-6 (2008).
Zhang et al., A InGaN/GaN quantum dot green ($\lambda$=524 nm) laser, Appl. Phys. Lett., 98:221104 (2011).
Enya, et al., "531 nm Green Lasing of InGaN Based Laser Diodes on Semi-Polar {2021} Free-Standing GaN Substrates," Appl. Phys. Express 2, 082101 (2009).
International Search Report and Written Opinion from PCT/US2012/070888 dated Apr. 29, 2013.
Jho, et al., "Field-dependent carrier decay dynamics in strained $In_xGa_{1-x}N$/GaN quantum wells,"Phys. Rev. B 66, 035334 (2002).
Li et al., "Carrier localization and nonradiative recombination in yellow emitting InGaN quantum wells," Appl. Phys. Lett. 96, 031906 (2010).
Lin, et al., "High Quality InGaN/AlGaN Multiple Quantum Wells for Semipolar InGaN Green Laser Diodes," Appl. Phys. Express 3, 082001 (2010).
Miyoshi et al. "510-515 nm InGaN-Based Green Laser Diodes on c-Plane GaN Substrate," Appl. Phys. Express 2, 062201 (2009).
Okamoto, et al., "Nonpolar m-plant InGaN Multiple Quantum Well Laser Diodes with a Lasing Wavelength of 499.8," Appl. Phys. Lett. 94, 071105 (2009).
Queren, et al., "500 nm electrically driven InGaN based laser diodes," Appl. Phys. Lett. 94, 081119 (2009).
Ueno, et al., "InGaN-based True Green Laser Diodes on Novel Semi-Polar {2 021} GaN Substrates," J. Cryst. Growth 315, 258 (2011).
Zhao et al., "Design and characteristics of staggered InGaN quantum-well light-emitting diodes in the green spectral regime," IET Optoelectronics, vol. 3, Iss. 6, pp. 283-295 (2009).
Mukai et al., Characteristics of InGaN-based UV/blue/green/amber/red light-emitting diodes, Jpn. J. Appl. Phys., 38:3976-81 (1999).
Nakamura et al., The Blue Laser Diode: The Complete Story, Chapter 14, 2nd edition, Springer (2000).
Ramaiah et al., Studies of InGaN/GaN multiquantum-well green-light-emitting diodes grown by metalorganic chemical vapor deposition, Appl. Phys. Lett., 85(3):401 (2004).
International Preliminary Report on Patentability from International Application No. PCT/US2012/070888 dated Oct. 9, 2014.
Wu, et al. "Electronic and optical properties of InGaN quantum dot based light emitters for solid state lighting," Journal of Applied Physics 105:013117-1 to 013117-7 (2009).
Han, et al., "Structural and optical properties of 3D growth multilayer InGaN/GaN quantum dots by metalorganic chemical vapor deposition," Journal of Crystal Growth, 266:423-428 (2004).
Park et al. "Green light-emitting diodes with self-assembled In-rich InGaN quantum dots," Applied Physics Letters 91:133105-1-133105-3 (2007).
Widmann, et al. "Blue-light emission from GaN self-assembled quantum dots due to giant piezoelectric effect," Physical Review 58(24):989-992 (1998).

\* cited by examiner

GAN-BASED QUANTUM DOT VISIBLE LASER

CROSS REFERENCE TO RELATED APPLICATIONS

The present application claims the benefit of U.S. Provisional Application No. 61/618,146, entitled "InGaN/GaN Quantum Dot Visible Lasers", filed on Mar. 30, 2012, which is hereby incorporated by reference herein in its entirety.

BACKGROUND

Solid state lighting (light emitting diodes (LEDs) and/or lasers) have been commonplace for decades, where devices emitting in the red and infrared wavelength region being most prevalent across industries. As commercial applications have grown, however, so too has the need for LEDs and lasers capable of emitting across different wavelengths, including the primary wavelengths associated with monitors and displays, i.e., red, blue, and green. With such a growing need, researchers have developed various ways of designing LEDs and lasers to emit at different ranges in the visible spectrum, as well as infrared and ultraviolet. Green-emitting light sources have garnered much attention recently, because of their potential use across applications, such as home/industrial lighting, full-color mobile projectors, optical data storage, and medical and military applications. Traditionally, green emitting sources were formed of bulk semiconductor diode-pumped lasers. More recently, lasers emitting over green wavelengths have been demonstrated using an Indium Gallium Nitride (InGaN)/Gallium Nitride (GaN) multi-quantum well active region. In contrast to traditional visible lasers, direct semiconductor visible laser diodes are miniature, more efficient and cheaper.

Despite the growing need for specific wavelength sources, primarily green emitting sources, InGaN/GaN multi-quantum well LED and laser design and fabrication have proved to be difficult. The mostly commonly available III-nitride materials and devices are along the c-plane of wurtzite structure; and the crystalline asymmetry leads to strong spontaneous and piezoelectric polarization fields. Consequently, electron-hole overlap is significantly reduced. The large amount of indium in the InGaN alloy also leads to indium rich clusters and composition inhomogeneity, which is detrimental to the performance of LEDs and lasers.

At the same time, the availability of bulk GaN substrates is currently limited, therefore foreign substrates (SiC, sapphire, and Si) are widely used. The resulting large lattice mismatch and thermal expansion discrepancy lead to high density of dislocations ($10^8$-$10^9$ cm$^{-2}$), which makes it challenging to realize high performance III-nitride LEDs and lasers. Therefore, visible lasers on sapphire substrates are still limited in ultraviolet (UV), violet and blue range of wavelength.

Queren, et al. (see, D. Queren, A. Avramescu, G. Bruderl, A. Breidenassel, M. Schillgalies, S. Lutgen, and U. Strauss, Appl. Phys. Lett. 94, 081119 (2009)) and Miyoshi et al. (see, T. Miyoshi, S. Masui, T. Okada, T. Yanamoto, T. Kozaki, S. Nagahama, and T. Mukai, Appl. Phys. Express 2, 062201 (2009)) have recently demonstrated quantum well green-emitting lasers on c-plane bulk GaN substrates. The threshold current densities, however, are quite large due to the reduced electron-hole overlap caused by the quantum confined Stark effect resulting from the large polarization fields associated with this design, especially for the longer wavelengths.

In order to tackle the above-mentioned polar-plane-related problems and enhance the device performance, one proposed approach is to utilize non-polar/semipolar GaN low dislocation density bulk substrates for which the polarization fields are much smaller, such as m-plane {1-100} and a-plane {11-20}. Several groups have demonstrated blue/green quantum well lasers on non-polar/semipolar substrates. These include, (i) K. Okamoto, J. Kashiwagi, T. Tanaka, and M. Kubota, Appl. Phys. Lett. 94, 071105 (2009); (ii) Y. Enya, Y. Yoshizumi, T. Kyono, K. Akita, M. Ueno, M. Adachi, T. Sumitomo, S. Tokuyama, T. Ikegami, K. Katayama, and T. Nakamura, Appl. Phys. Express 2, 082101 (2009); (iii) Y.-D. Lin, S. Yamamoto, C.-Y. Huang, C.-L. Hsiung, F. Wu, K. Fujito, H. Ohta, J. S. Speck, S. P. DenBaars, and S. Nakamura, Appl. Phys. Express 3, 082001 (2010); and (iv) M. Ueno, Y. Yoshizumi, Y. Enya, T. Kyono, M. Adachi, S. Takagi, S. Tokuyama, T. Sumitomo, K. Sumiyoshi, N. Saga, T. Ikegami, K. Katayama, and T. Nakamura, J. Cryst. Growth 315, 258 (2011). However, the lack of large size non-polar and semipolar substrates, the lower stability of the growth window and poor indium incorporation during growth of InGaN/GaN quantum wells on these substrates has impeded laser development.

In addition to the epitaxy related problems, problems related to the formation of the laser facets also need to be addressed. The existence of the foreign substrates makes the laser facet cleaving almost impossible. For lasers grown on bulk GaN substrates, most conventional studies utilized cleaved sides coated with high reflective dielectric coating, but this process lacks reproducibility. Additionally, the cleaving approach does not create perfect facets on nonpolar/semipolar plane lasers. It is therefore desirable to realize mirrors having smooth surface with techniques of high precision and high reproducibility for all the crystal planes.

Consequently, a need still remains for development of high performance blue-green emitting lasers along c-plane direction. This invention aims to radically improve the visible laser performance with InGaN/GaN quantum dots incorporated into the laser active region and laser facets formed by FIB etching/polishing or cleaving.

SUMMARY OF THE INVENTION

The present techniques describe a nitride-based quantum dot (QD) laser, for the first time, that is electrically pumped by carriers, i.e., electrons and holes, for producing a coherent, collimated emission with narrow linewidth, with lower threshold current densities, higher differential gain and higher slope efficiencies than conventional quantum well lasers. The resulting emission from the electrically injected designs may be at a single wavelength within the violet wavelength region (400-440 nm), the blue wavelength region (440-490 nm) or the green wavelength region (490-570 nm). The particular emission wavelength is determined by the quantum dot configuration and properties thereof. For the present techniques, a quantum dot layer structure is used to form a laser active region producing the output emission. More specifically, that layer structure includes one or more layers of InGaN/GaN quantum dots forming the heterostructure. It should be noted that InGaN/GaN quantum dots can be formed by self-organization, nano-patterning, or quantum well/barrier interface roughness.

The present quantum dot techniques are able to produce output emissions at linewidths considerably lower than previous, quantum well laser attempts, especially in the green wavelength region. The piezoelectric field and resulting quantum confined Stark effect have been significantly lowered using the disclosed self-organized epitaxial growth process to form the InGaN/GaN quantum dots. This leads to smaller carrier lifetimes compared to those in quantum wells. The higher degree of confinement of carriers, compared to that in quantum wells, also leads to a reduced rate of carrier recombination at dislocations and related defects. By replacing InGaN/GaN quantum wells with InGaN/GaN quantum dots in the active region, the differential gain is increased by an order of magnitude. The threshold current has been reduced to 1.2 kA/cm$^2$ for green emitting InGaN/GaN quantum dot lasers, which is nearly one order of magnitude lower than that of InGaN/GaN multi-quantum well lasers.

Self-organized growth during epitaxy determines the quantum dot size and position. Various characteristics of the quantum dot layer structure are then, in turn, determined by these properties. The quantum dot size and position inhomogeneity leads to a broad wavelength output. Wavelength linewidth (measured as the full-width half maximum of the emission spectrum) of below 10 nm, and preferably below 1 nm, is expected in InGaN/GaN quantum dot laser due to the large differential gain.

Furthermore, the self-organized quantum dots are designed to produce a relatively low threshold current density for lasing, an order of magnitude or greater lower than those of quantum well-based InGaN/GaN lasers, mentioned herein.

In some embodiments, the design, fabrication and characteristics of a green emitting (e.g., 524 nm output emission wavelength) InGaN/GaN QD laser grown on bulk c-plane GaN substrate is provided. Particular laser facets were uniquely fabricated using a focused ion beam (FIB) etching process designed to create smooth and defect-free facets.

The quantum dot size and position are determined, in part, from the tendency of strained layer semiconductors to form islands when the strain exceeds a certain threshold value. With the present techniques, InGaN islands are formed on a GaN substrate, e.g., by molecular beam epitaxy. A plurality of these quantum dots forms a quantum dot layer; and one or more of these layers are used to form the laser active region.

The resulting design has been shown to have threshold current densities that are much lower than conventional quantum well lasers, emitting in the green. Using the InGaN/GaN QD layer structure as the active region of a laser device, InGaN/GaN QD lasers exhibiting a threshold current density of $J_{th}$=1.2 kA/cm$^2$ have been shown allowing for more efficient pumping by an order of magnitude or greater than quantum well designs, which have been shown to exhibit threshold current densities of 8.9 kA/cm$^2$ or higher.

Example laser devices in which the present techniques may be applied include broad area laser devices, ridge-waveguide laser devices, single mode laser devices, single wavelength laser devices, multiple wavelength laser devices, and tunable laser devices.

The operative InGaN/GaN quantum dot layer structure may serve as the active region in a p-i-n laser diode structure that also includes optical waveguides that collect the emission from the quantum dot layer structure and confine that emission for laser operation. For example, a formed laser device may have an optical cladding layer and a first undoped waveguide core layer having a first doping polarity, a quantum dot active region, a second waveguide core layer and another optical cladding layer grown having a second doping polarity.

In some examples, the quantum dot layer structure is formed of InGaN quantum dots on a GaN substrate and capped with a GaN barrier, to form InGaN/GaN quantum dots.

In some examples, the quantum dot layer structure is configured to produce an emission at a wavelength of 400-490 nm having a linewidth of 1 nm or smaller. In some examples, the quantum dot layer structure is configured to produce an emission at a wavelength of 490-570 nm having a linewidth of 1 nm or smaller.

In accordance with an example, a laser including: a contact layer structure for injecting conduction carriers into an active region of the laser; a semiconductor optical waveguide structure; a laser cavity; and a GaN-based quantum dot layer structure within the laser cavity and configured as the active region of the laser, the quantum dot layer structure comprising at least one layer of quantum dots each positioned and sized in a self-organizing manner to produce an emission of 400 nm-700 nm the laser cavity structure and the quantum dot layer structure being configured to produce, in response to injection of the conduction carriers into the active region via the contact layer structure, a laser output having a linewidth of less than about 1 nm.

In some examples, a method of forming a laser structure, the method includes: forming a semiconductor optical waveguide structure on a GaN substrate or on a GaN template on a foreign substrate; forming a GaN-based quantum dot layer structure as an active region of the laser structure when confined within a laser cavity, forming the quantum dot layer structure from at least one layer of quantum dots, each quantum dot positioned and sized in a self-organizing manner to produce an emission of 400 nm-700 nm the laser cavity structure, wherein the quantum dot layer structure is formed to have an InGaN/GaN structure and is configured to produce, in response to injection of the conduction carriers into the active region via the contact layer structure, a laser output having a linewidth of less than about 1 nm; providing a contact layer structure for injecting conduction carriers into the active region of the laser structure; and providing the laser cavity confining the active structure, to produce the laser output.

In some examples, providing the lasing cavity comprises using a focused ion beam etching process or cleaving to form opposing facets in the laser structure.

In some examples, the quantum dot layer structure is formed of InGaN quantum dots on a GaN substrate and capped with a GaN barrier to form InGaN/GaN quantum dots. In some such examples, the InGaN/GaN quantum dots have an indium mole fraction of between 10%-27% to form InGaN/GaN quantum dots.

In some examples, The method of claim 16, wherein the quantum dot layer structure comprises a plurality of layers of quantum dots.

DETAILED DESCRIPTION

The present techniques describe a nitride-based quantum dot laser that is pumped by conduction carriers, i.e., electrons and holes, to produce a narrow linewidth output emission in the visible wavelength region. As used herein, the term quantum dot refers to three-dimensional quantum-confined heterostructures in which carriers (electrons and holes) are confined to a region that is less than a de Broglie wavelength. This typically amounts to dimensions that are less than about 100 nm in all three dimensions, generally measured in a two-dimensional width and a height. The quantum dots can be formed by self-organization, nano-patterning, and quantum well/barrier intereface roughness. A layer structure is formed from these quantum dots and used as the active region of a laser to produce the desired narrow linewidth output emission. That layer structure includes one or more layers (e.g., 1 to 20 layers), each containing InGaN/GaN quantum dots with areal density of approximately $5 \times 10^{10}/cm^2$ forming the heterostructure.

Figure 1A:
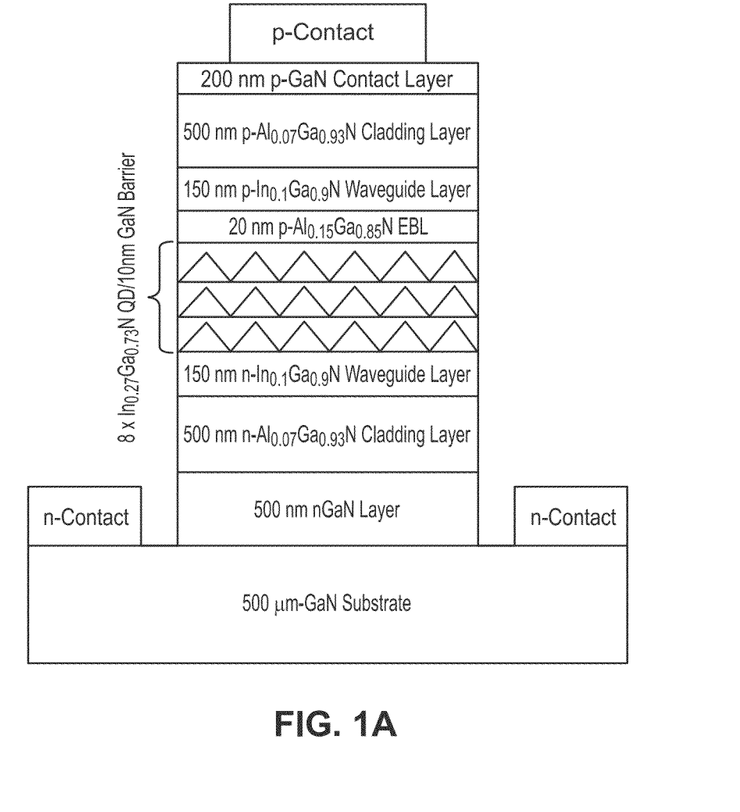
FIG. 1A illustrates an InGaN/GaN QD laser heterostructure, showing various layers and layer compositions, in accordance with an example.

FIG. 1A illustrates an InGaN/GaN QD laser heterostructure, showing various layers and layer compositions, in an example implementation of the present technique. A quantum dot layer structure is shown formed of an InGaN/GaN QD heterostructure comprising a plurality of layers and each layer formed of a plurality of self-organized InGaN/GaN quantum dots. In the illustrated green-emitting example, the composition of the QD laser heterostructure is $In_{0.27}Ga_{0.73}N/GaN$. In an example discussed below, eight quantum dot layers were grown to form a broad area green-emitting laser device. However, the number of layers and the number and density of the quantum dots in each laser may vary, e.g., depending on the desired output characteristics of the heterostructure and overall device.

The InGaN/GaN quantum dot layer structure was grown by plasma-assisted molecular beam epitaxy on a bulk c-plane GaN substrate. The inherently lower growth temperature in molecular beam epitaxy makes it easier for indium incorporation. The MBE system is equipped with standard In, Ga, Al, Mg, Si effusion cells and a UNI-bulb RF plasma nitrogen source. The substrates were cleaned with solvent cleaning followed by thermal degassed in intro-chamber (200° C. for 60 min) and buffer chamber (450° C. for 60min). Growth temperatures were monitored by an infrared pyrometer calibrated by Si RHEED (reflection high-energy electron diffraction) pattern transition from (7×7) to (1×1) at 830° C. For green-emitting quantum dots, the growth temperatures were maintained at 520-580° C. depending on the desired emission wavelengths. The quantum dots were formed under nitrogen rich condition after an initial GaN buffer layer. The indium and gallium fluxes were monitored by ion gauges and the In/Ga ratio was kept between 0.8 to 1.2 for green emitting quantum dots. The growth rate of the quantum dots was 1.1 Å/sec. Due to the large lattice mismatch between InN and GaN (11%), the accumulated strain at the interface between GaN and InGaN epi layers was relieved by formation of coherent quantum dots. The onset of the quantum dot formation occurs at ~7 ML of InGaN deposition, evidenced by in situ RHEED system. Before the quantum dot formation, the RHEED pattern was thin and streaky; it turned spotty at the onset of the 2D-3D transition and recovered during the GaN quantum barrier growth. The quantum dots can provide better electron hole overlap and increased radiative recombination rates, compared to quantum wells. Additionally, indium cluster and inhomogeneity issues in In-rich quantum wells are nearly absent in QDs. More importantly, the strain relaxation during the quantum dot growth pronouncedly reduces the polarization field in the active region, which reduces the quantum confined Stark effect and increases the electron hole wavefunction overlap. At the device level, a smaller blueshift in emission wavelength in quantum dot LEDs and lasers and a much reduced threshold current density in quantum dot lasers were observed compared to their quantum well counterparts (the details will be described later).

It should be noted here, the quantum dot heterostructure may also be realized by other epitaxy techniques, such as metal-organic vapor phase epitaxy, atomic layer deposition, and hydride vapour phase epitaxy or a combination thereof. InGaN/GaN quantum dots can be formed by self-organization, nano-fabrication, or quantum well interface roughness, to achieve three-dimensional quantum confinement, dislocation density reduction, or/and less polarization field in the active region. InGaN/GaN quantum dots can be formed on different crystal planes, including polar, semi-polar, non-polar planes. Quantum dot layer structures as formed herein may achieve, not only three-dimensional quantum confinement, but also better electron-hole overlap, reduced radiative lifetime, lower density of dislocation, and less polarization, in comparison to quantum well structures.

The GaN substrate is an n-type doped 500 μm bulk substrate, with a formed 500 nm GaN n-typed doped buffer layer to provide a more heavily doped layer and remove the interface influence on the devices. A first cladding layer was grown on top of the GaN buffer layer. In the illustrated example, the first cladding layer is an n-type doped $Al_{0.07}Ga_{0.93}N$ cladding layer having an index of refraction of 2.48 at 524 nm. The cladding layer is 500 nm thick and bounds a first waveguide layer formed of a 150 nm thick n-type $In_{0.1}Ga_{0.9}N$ waveguide layer having an index of refraction of 2.54 at 524 nm. The InGaN/GaN quantum dot layer structure formed under the above-mentioned growth condition is sandwiched between this first waveguide layer and a second waveguide layer nearly identical to the first waveguide layer but formed as a p-type doped layer, which is itself bound by a second cladding layer, similar to the first except likewise p-type doped. Finally, a 200 nm thick p-GaN contact layer is capped atop.

In the illustrated example, a 20 nm p-type $Al_{0.15}Ga_{0.85}N$ electron blocking layer (EBL) is provided to block n-type carriers, i.e., electrons, injected from the lower device substrate from passing through the quantum dot layer structure, without recombining with holes. The blocking layer serves to suppress the escape of these carriers, thereby reducing potential for recombination in the p-type upper layer structures and increasing quantum conversion efficiency, and lowering threshold current density, in the quantum dot layer structure. Because electrons are a relatively fast moving carrier compared to holes, the illustrated example has been fabricated with the EBL layer. In other examples, a hole blocking layer may be used for further confinement.

The resulting laser device in FIG. 1A is an electrically injected InGaN/GaN QD laser capable of emitting at a green wavelength, specifically, the valuable 524 nm green wavelength, with narrow linewidths of 0.7 nm and a threshold current density of $J_{th}$=1.2 kA/cm$^2$ at 278 K. The lasing wavelength can be tuned by changing any of the indium mole fraction in the quantum dots, the size of the quantum dots, and/or the indium mole fraction in the InGaN waveguide layers.

Figure 1B:
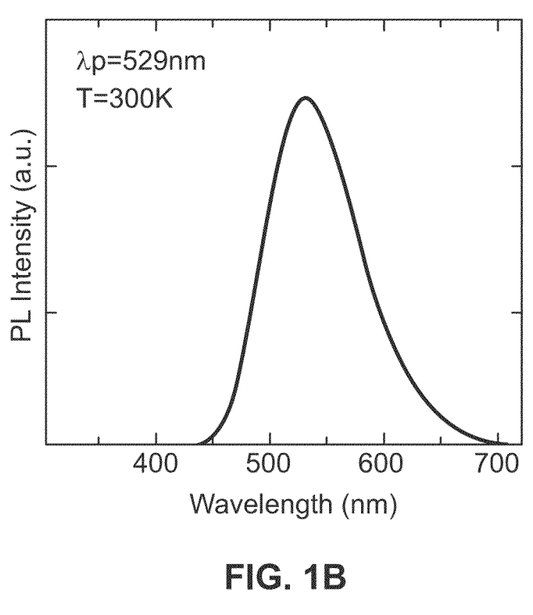
FIG. 1B is a plot the photoluminescence spectrum for the laser structure of FIG. 1A, in accordance with an example.
Figure 1C:
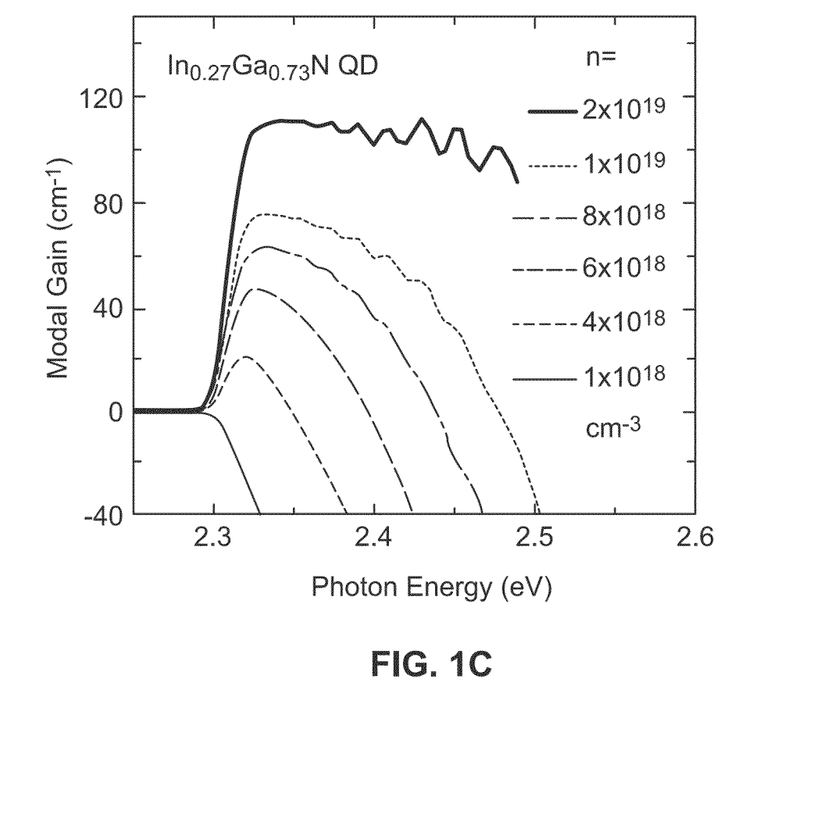
FIG. 1C is a plot of the modal gain for different injection carrier densities of quantum dot layer structures.

FIG. 1B illustrates the photoluminescence spectrum for the laser structure of FIG. 1A, excited by a 325 nm He—Cd laser source. The gain and differential gain of the $In_{0.27}Ga_{0.73}N$/GaN quantum dots were calculated using a reported electron-hole overlap function value of 0.6 for such QDs. The strain in the fabricated quantum dots is very small due to the strain relaxation during the QD formation, resulting in the polarization arising almost entirely from spontaneous polarization. The InGaN/GaN quantum dots had dimensions less than 100 nm for the base width and less than 10 nm in height. Specifically, a base width and height of 50 nm and 3 nm were formed with a wetting layer thickness of 0.5 nm.

Figure 4A:
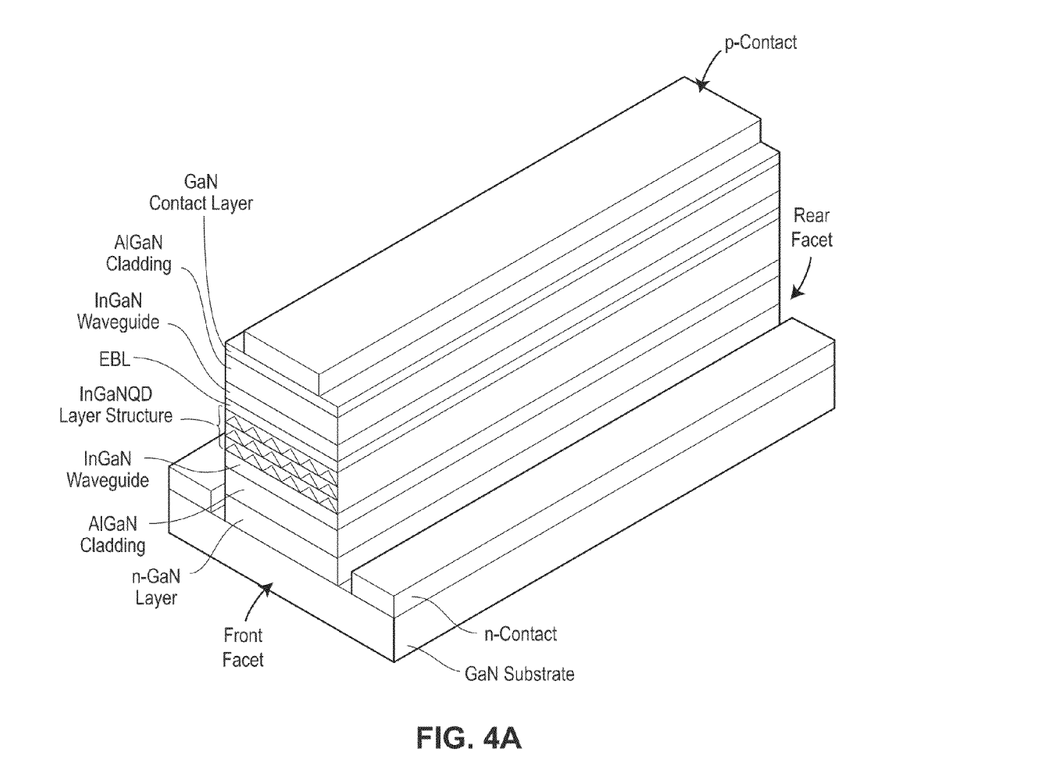
FIG. 4A is a perspective view of a quantum dot laser structure having a plurality of quantum dot layers formed of various InGaN/GaN quantum dots and without end reflector layers, in accordance with an example.
Figure 4B:
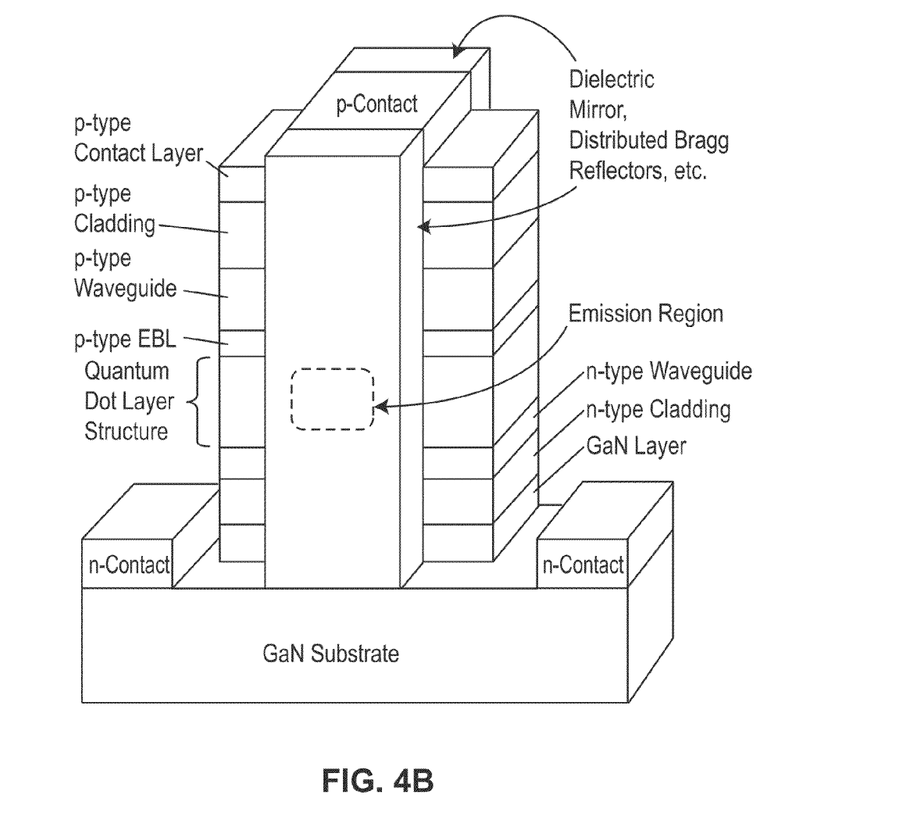
FIG. 4B is an end view of a quantum dot laser structure having a plurality of quantum dot layers and with reflector layers or distributed Bragg reflectors on the laser cavity ends, in accordance with an example.

For the green emitting quantum dots, the optical confinement factor for 8 layers of quantum dot-layers was found to be 0.07. This optical confinement factor is achieved with $Al_{0.07}Ga_{0.93}N$ cladding layer and $In_{0.1}Ga_{0.9}N$ waveguide layer, both at n-side and p-side. The thickness of the $Al_{0.07}Ga_{0.93}N$ cladding layer is 500 nm to prevent from lattice mismatch induced film cracking. A Gaussian linewidth factor of $\sigma$=6.6 meV was used to account for inhomogeneous broadening of the spontaneous emission. The calculated modal gains, $\Gamma g$, for a distribution of injected carrier densities are shown in FIG. 10. From this data, a maximum differential gain of $\sim 1.5 \times 10^{-16}$ cm$^2$ was determined. This value is larger than those reported for similar InGaN/GaN QWs, by an order of magnitude. FIGS. 4A and 4B illustrate a portion of a quantum dot layer structure comprising a plurality of layers each formed of a various InGaN/GaN quantum dots. FIG. 4B shows a configuration similar to that of FIG. 1A, but having laser cavity mirrors in the form of dielectric mirrors, distributed Bragg reflectors, or the like.

The laser heterostructure, shown in FIG. 1A (i.e., the GaN buffer layer through the upper surface p-GaN contact layer) was grown on 500 μm thick c-plane n-GaN bulk substrates (with a defect density <5×10$^6$ cm$^{-2}$) by plasma-assisted molecular beam epitaxy and including the $Al_{0.15}Ga_{0.85}N$ electron blocking layer. The GaN and AlGaN layers in the laser heterostructure were grown at 740 and 770° C., respectively and the eight layers of QDs were grown at 520° C. for green emitting quantum dot. The $In_{0.1}Ga_{0.9}N$ waveguide regions were grown at 610° C. A shorter wavelength (violet or blue) output emitting laser may be formed using the layer configuration similar to FIG. 1A, but using a growth temperature for the layers of QDs (i.e., the active region) higher than that of the 520° C. described above (e.g. 610° C. for 420 nm emission), so that less indium incorporates into the quantum dots.

Figure 1D:
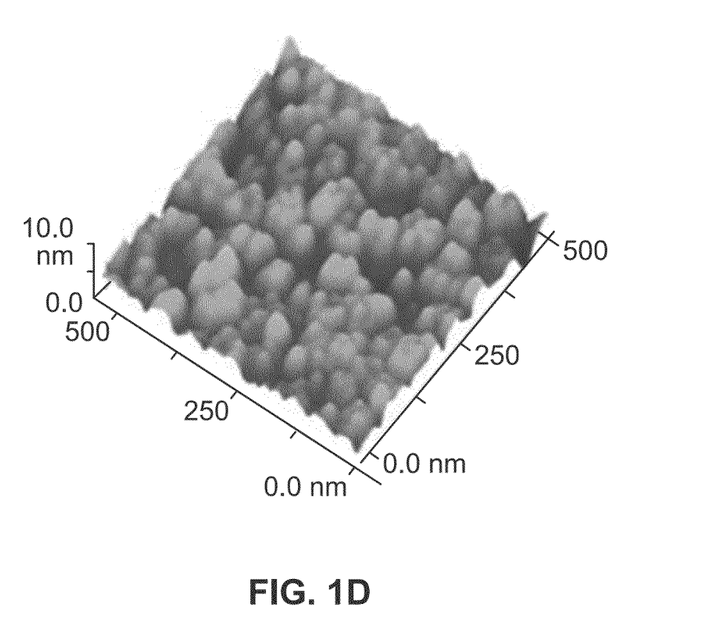
FIG. 1D is an atomic force microscopy image of a quantum dot layer, in accordance with an example.

FIG. 1D shows the atomic force microscopy (AFM) image of a quantum dot layer, from which a dot density of 5×10$^{10}$ cm$^{-2}$ was observed, with a quantum dot height and diameter of 3 nm and 50 nm, respectively.

The carrier concentration in the 500 nm GaN buffer layer was n=5×10$^{18}$ cm$^{-3}$. The carrier concentrations in the 500 nm n-$Al_{0.07}Ga_{0.93}N$ cladding layer and 150 nm n-InGaN waveguide region were n=2×10$^{18}$ cm$^{-3}$ and n=1.5×10$^{18}$ cm$^{-3}$, respectively. The carrier concentrations in the p-$In_{0.1}Ga_{0.9}N$ waveguide region, p-$Al_{0.15}Ga_{0.85}N$ EBL, and p-$Al_{0.07}Ga_{0.93}N$ cladding layer were p=2×10$^{17}$ cm$^{-3}$, p=8×10$^{17}$ cm$^{-3}$, and p=3×10$^{17}$ cm$^{-3}$, respectively. Finally, the carrier concentration in the upper p-GaN contact layer is p=2×10$^{18}$ cm$^{-3}$, the highest achieved in this material.

The room temperature photoluminescence (PL) spectrum of the green-emitting quantum dot active region is shown in FIG. 1B, showing a peak at 529 nm. We measured an excitation dependent electroluminescence in a InGaN/GaN QD LED having a peak output emission at λ=522 nm. From the shift in the luminescence peak due to electron injection, a polarization field of 90 kV/cm was derived, which is much smaller than the 2 MV/cm typically measured in quantum well structures. We have also performed time resolved PL measurements on the quantum dot heterostructures. From this data and the measured internal quantum efficiency of the quantum dots of approximately 40%, we derive radiative and non-radiative lifetimes of 1.5 ns and 1.0 ns, respectively. In comparison, the radiative and nonradiative lifetimes in green-emitting InGaN/GaN quantum wells are approximately 380 ns and approximately 120 ns, respectively. The greatly reduced radiative lifetime, compared to those in quantum well lasers, confirmed the low polarization field in the dots.

The structure of FIG. 1A was formed into a broad area edge-emitting laser or a ridge waveguide laser fabricated by mesa etching, p- and n-contact metallization layers (the p-type GaN contact layer Ni/Au/Ti/Au and the n-type contact layer Ti/Au), dielectric deposition and p-contact annealing. Conduction carrier injection into the quantum dot layer structure is therefore achieved through electric current pumping into these contacts.

Figure 2A:
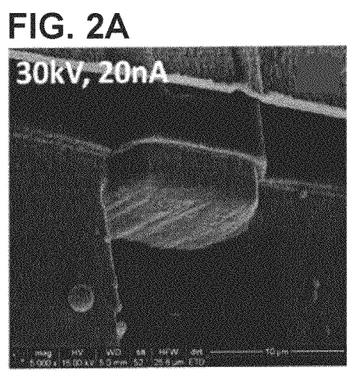
FIGS. 2A-2D are scanning electron microscope images of laser facets created using focused ion beam etching and different beam currents, respectively.
Figure 2B:
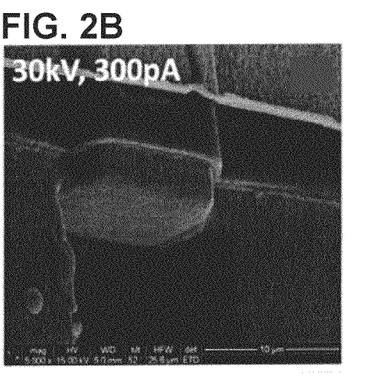
Figure 2C:
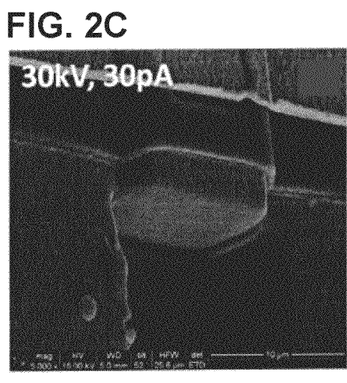
Figure 2D:
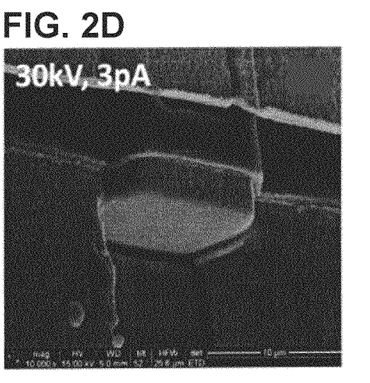

High quality facets are used since the cavity loss is already high for long wavelength laser cavity. Subsequent to contact formation, instead of using traditional cleaving to create the mirrors, a focused ion beam (FIB) etching was employed to create smooth and defect-free facets, forming the reflective laser cavities. Techniques other than FIB may be used to form the facets, techniques such as cleaving—although FIB may better allow formation of lasers integrated on a chip for certain applications. In a two-step process, the facet and trench were initially formed by gallium FIB etching with a beam current of 20 nA and voltage of 30 kV. The trench allowed for scatter-free light emission and collection. However, the facet created with this beam current was relatively rough as shown in FIG. 2A. To minimize optical loss at the facets, a second FIB etch with successively smaller beam currents ranging from 300 to 3 pA was employed. The results shown in FIGS. 2B-2D are the SEM images of the etched facets after beam currents of 300 pA, 30 pA, and 3 pA, respectively. The length and width of the laser cavity were 1.5 mm and 6 μm, respectively.

Light-current-voltage characteristics were measured at room temperature with a pulsed bias (0.05% duty cycle, 1 μs pulse width) at room temperature.

Figure 3A:
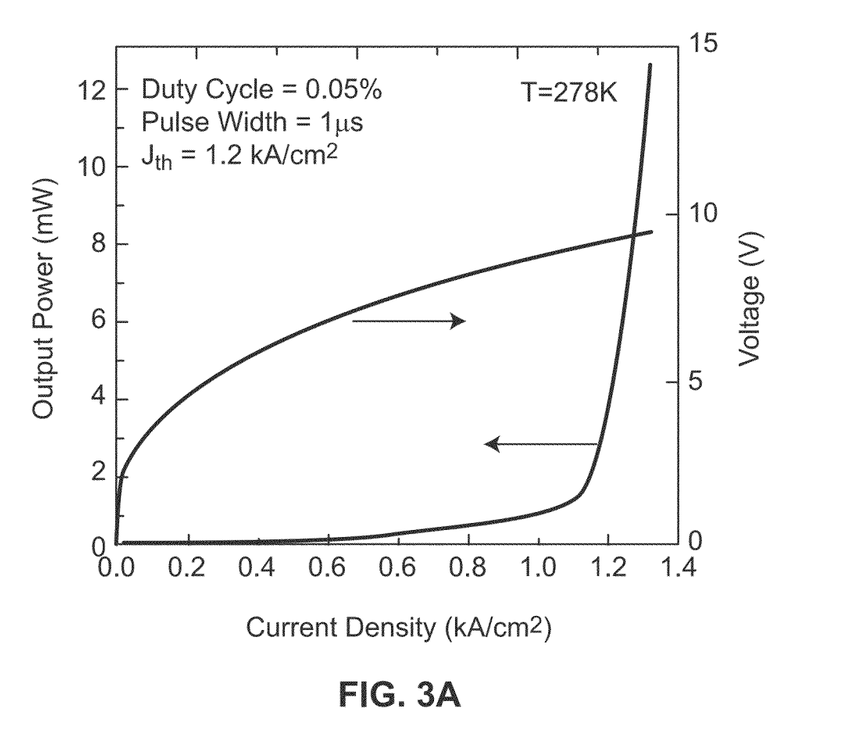
FIG. 3A is a plot of output power and voltage for different current densities for a green emitting laser, in accordance with an example.

The measured L-I-V results for green emitting lasers are shown in FIG. 3A. The laser mount was cooled by a thermo-electric cooler to 5° C. to avoid excessive device heating. Even with this, the junction and facet temperatures were estimated to be well above 300 K. The threshold current was 110 mA, which corresponded to a threshold current density of approximately 1.2 kA/cm$^2$, which is lower than those reported for QW lasers. An output power of 12.5 mW was measured for an injection current of 120 mA. The slope efficiency was determined to be 0.74 W/A from the L-I characteristics. The corresponding wall plug efficiency was 1.1%, wall plug efficiency being the ratio of optical output power to electrical input power.

Notably, the lasing was achieved with the FIB-etched facets alone and without any additional deposition of dielectric distributed Bragg reflectors (DBRs). The superior performance characteristics of the quantum dot laser are attributed to the smaller polarization fields and better electron-hole overlap in quantum dots and smooth laser facets created by FIB etching.

A green emitting laser made from another heterostructure and emitting at a slightly higher wavelength ($\lambda$=552 nm), in which DBRs were incorporated over the FIB-etched facets, exhibited a threshold current density of 2.0 kA/cm$^2$. FIG. 4A illustrates a laser without DBR or reflector layers; and FIG. 4B illustrates a laser with DBR or reflector layers.

Figure 3B:
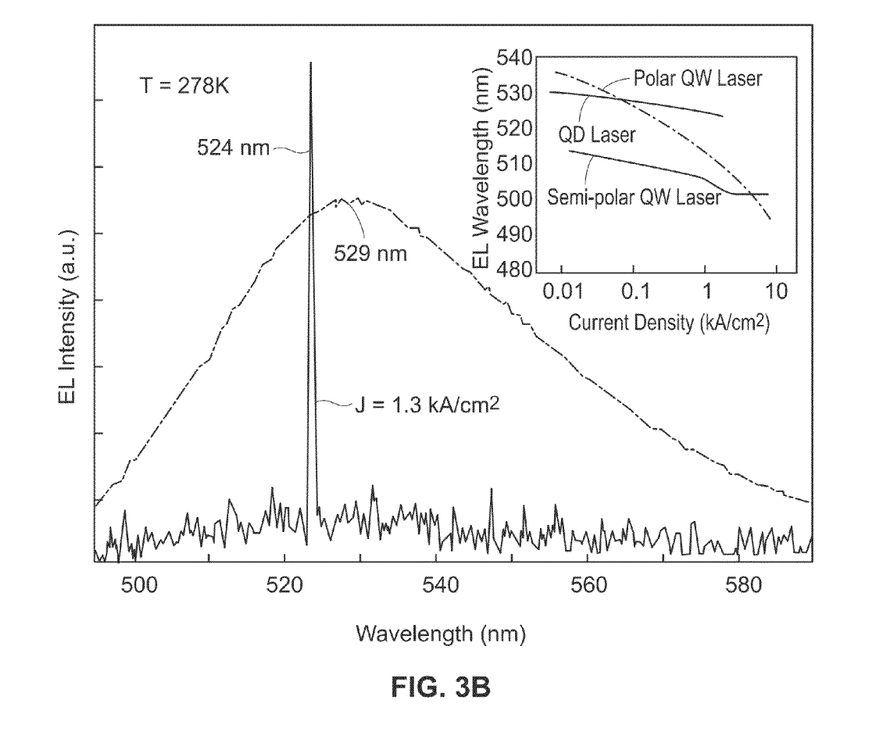
FIG. 3B is a plot of the spectral output (electro-luminescent intensity) as a function of wavelength for a quantum dot laser, in accordance with an example, further indicating the measured variation in electroluminescence peak wavelength with injection current of a quantum dot laser, polar quantum well laser, and semi-polar quantum well laser.

The spectral output characteristics of the green emitting laser were measured below and above threshold. The spectral output for an injection current of 120 mA (J=1.33 kA/cm$^2$) under pulsed bias condition is shown in FIG. 3B. The emission was characterized by a peak at 524 nm and a linewidth of 0.7 nm. In contrast, a broad emission with a linewidth of 54 nm is measured with dc biasing below threshold. The peak of the electroluminescence (EL) spectrum below threshold occurs at the same wavelength, 529 nm, as the PL spectrum shown in FIG. 1B. The slightly wider linewidth of the spontaneous emission, compared to that typically observed for quantum wells, is most probably due to inhomogeneity in quantum dot size and alloy composition. The blue-shift in 5 nm between the lasing and luminescence peaks is smaller than the approximately 12 nm shift reported for a InGaN/GaN MQW green emitting laser grown on semipolar GaN and significantly smaller than that measured for lasers grown on polar GaN. The inset of FIG. 3B shows the measured variation in electroluminescence peak wavelength, $\lambda_p$, with injection current, up to threshold, as the QD green emitting laser curve. In comparison, the inset also presents plots for the typical $\lambda_p$ blueshift with current density in polar QW lasers and in semi-polar QW lasers, respectively. The smaller $\lambda_p$ blueshift in QD lasers is due to a much reduced polarization field in the quantum dots.

Figure 3C:
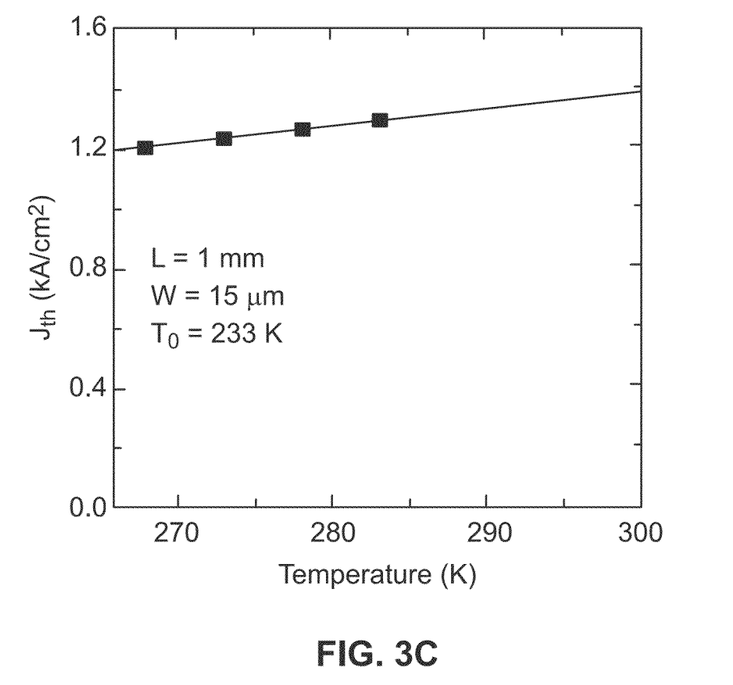
FIG. 3C is a plot of threshold current density as a function of temperature, in accordance with an example.

The temperature dependence of the threshold current was measured in a similar device with length and width of 1 mm and 15 μm, respectively, and having FIB-etched mirrors. By fitting the data shown in FIG. 3C with $J_{th}(T)=J_{th}(O)e^{T/T_o}$, we obtained a value of $T_0$=233 K in the temperature range of 260-300 K.

The same layer configuration may be used to produce an output laser emission in other portions of the visible spectrum, including violet (400-440 nm), blue (440-490 nm), yellow (570-590 nm), orange (590-620 nm), and red (620-700 nm) portion of the spectrum.

As shown, the present techniques may be used to form InGaN/GaN quantum dot lasers that may have considerable performance advantages over equivalent quantum well lasers. InGaN/GaN quantum dot lasers have been demonstrated with electron hole overlap of 0.6, which is upwards of 4 times higher than that reported in corresponding InGaN/GaN quantum well lasers, see, e.g., Zhao et al., "Design and characteristics of staggered InGaN quantum-well light-emitting diodes in the green spectral regime," IET Optoelectronics (2009), Vol. 3, Iss. 6, pp. 283-295. Quantum dot lasers have been demonstrated with radiative lifetimes of 1.5 ns, which is two orders of magnitude smaller than some reported quantum well structures, see, e.g., T. Li et al., "Carrier localization and nonradiative recombination in yellow emitting InGaN quantum wells," Appl. Phys. Lett. 96, 031906 (2010). Quantum dot lasers have been demonstrated with polarization fields of 90 kV/cm, which is an order of magnitude lower than that in some reported quantum well structures, see, e.g., Y. D. Jho, J. S. Yahng, E. Oh, and D. S. Kim, "Field-dependent carrier decay dynamics in strained In$_x$Ga$_{1-x}$N/GaN quantum wells," Phys. Rev. B 66, 035334 2002. A lower density of dislocations results in some examples as well.

The present techniques may be used to form an InGaN/GaN quantum dot laser able to emit at any visible region of the spectrum, as well as, in some examples, regions outside the visible, such as in the ultraviolet region. Furthermore, the particularly layer configuration, doping concentration, and molar count for the various layers are provided above by way of example, not limitation. Additional layers of sub-layer features may be implemented as needed. Further still, the present techniques may be used to form GaN-based quantum dot layer structures having a plurality of layers of InGaN/AlGaN quantum dots, InGaAlN/AlGaInN quantum dots, or other compositions.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding; and no unnecessary limitations should be understood therefrom, as modifications within the scope of the invention may be apparent to those having ordinary skill in the art.

The invention claimed is:

1. A laser comprising:
   a contact layer structure for injecting conduction carriers into an active region of the laser;
   a semiconductor optical waveguide structure;
   a laser cavity; and
   a GaN-based quantum dot layer structure within the laser cavity and configured as the active region of the laser, the quantum dot layer structure comprising at least one layer of quantum dots each positioned and sized in a self-organizing manner to produce (i) an array of self-organized quantum dots extending the entire at least one layer and characterized by strain relaxation induced from the self-organizing and (ii) a laser emission having a wavelength of 490 nm-570 nm from the laser cavity structure and the quantum dot layer structure being configured to produce, in response to injection of the conduction carriers into the active region via the contact layer structure, the laser emission having a linewidth of 1 nm or smaller, the at least one layer of quantum dots exhibiting an wavelength shift on the laser emission of no more than about 5 nm over a range of injection currents from an initial injection current to a threshold current of the at least one layer of quantum dots, wherein the laser is characterized by a threshold injection current density of 1.2 kA/cm$^2$.

2. The laser of claim 1, wherein the quantum dot layer structure is formed of InGaN quantum dots on a GaN substrate and capped with a GaN barrier to form InGaN/GaN quantum dots.

3. The laser of claim 2, wherein the InGaN/GaN quantum dots have an indium mole fraction of between 10%-27% to form InGaN/GaN quantum dots.

4. The laser of claim 1, wherein the quantum dot layer structure comprises a plurality of layers of quantum dots.

5. The laser of claim 1, wherein the contact layer structure comprises a p-type contact layer formed of GaN and an n-type contact layer formed of a GaN n-type doped layer.

6. The laser of claim 1, wherein the semiconductor optical waveguide structure comprises AlGaN cladding layers surrounding one or more InGaN waveguide layers positioned to confine the emission from the quantum dot layer structure.

7. The laser of claim 6, the laser further comprising an electron blocking layer positioned adjacent the quantum dot laser structure for reducing leakage of injected electrons from the contact layer structure.

8. The laser of claim 1, wherein the quantum dot layer structure is configured to produce the laser emission at a wavelength of 524 nm having a linewidth at 1 nm or smaller.

9. The laser of claim 1, wherein the laser has a threshold injection current density as low as 1.2 kA/cm$^2$ for emissions in a green region with a wavelength of 524 nm.

10. The laser of claim 1, wherein each of the plurality of quantum dots has a base width of about 50 nm and a height of about 3 nm.

11. The laser of claim 1, wherein each of the plurality of quantum dots has a disk-like structure having a circular or near circular base.

12. The laser of claim 1, wherein each layer of quantum dots has an areal density of $1 \times 10^1$ cm$^{-2}$-$10 \times 10^{10}$ cm$^{-2}$.

13. The laser of claim 1, wherein the laser cavity structure comprises a first facet and a second facet, wherein the quantum dot layer structure and the semiconductor optical waveguide structure are disposed between the first facet and the second fact, and wherein the first facet and the second facet have been fabricated using a focused ion beam technique.

14. The laser of claim 1, wherein the quantum dot layer structure is configured to produce the emission at a wavelength of 400 nm-490 nm having a linewidth of 1 nm or smaller.

15. The laser of claim 1, wherein the quantum dot layer structure is configured to produce the emission at a wavelength of 490 nm-570 nm having a linewidth of 1 nm or smaller.

16. A method of forming a laser structure, the method comprising:
providing a contact layer structure for injecting conduction carriers into the active region of the laser structure; and
providing the laser cavity confining the active structure, to produce the laser output;
forming a semiconductor optical waveguide structure on a GaN substrate or on a GaN template on a foreign substrate;
forming a GaN-based quantum dot layer structure as an active region of the laser structure when confined within a laser cavity, forming the quantum dot layer structure from at least one layer of quantum dots, each quantum dot positioned and sized in a self-organizing manner to produce (i) an array of self-organized quantum dots extending the entire at least one layer and characterized by strain relaxation induced from the self-organizing and (ii) a laser emission having a wavelength of 490 nm-570 nm from the laser cavity structure, wherein the quantum dot layer structure is formed to have an InGaN/GaN structure and is configured to produce, in response to injection of the conduction carriers into the active region via the contact layer structure, the laser emission having a linewidth of 1 nm or smaller, the at least one layer of quantum dots exhibiting an wavelength shift on the laser emission of about 5 nm or less over a range of injection currents from an initial injection current to a threshold current of the at least one layer of quantum dots, wherein the laser is characterized by a threshold injection current density of 1.2 kA/cm$^2$.

17. The method of claim 16, wherein providing the laser cavity comprises using a focused ion beam etching process to form opposing facets in the laser structure.

18. The method of claim 17, wherein focused ion beam etching process was performed at an electron beam voltage of 30 kV and at a beam current of 20 nA, 300 pA, 30 pA, 3 pA, or a consecutive combination of one or more of these beam currents.

19. The method of claim 16, wherein providing the laser cavity comprises using a cleaving process to form opposing facets in the laser structure.

20. The method of claim 16, wherein the quantum dot layer structure is formed of InGaN quantum dots on a GaN substrate and capped with a GaN barrier to form InGaN/GaN quantum dots.

21. The method of claim 20, wherein the InGaN/GaN quantum dots have an indium mole fraction of between 10%-27% to form InGaN/GaN quantum dots.

22. The method of claim 16, wherein the quantum dot layer structure comprises a plurality of layers of quantum dots.

23. The method of claim 16, further comprising forming a contact layer structure for the laser structure, the contact layer structure comprising a p-type contact layer formed of GaN and an n-type contact layer formed of a GaN n-type doped layer.

24. The method of claim 16, further comprising forming an electron blocking layer positioned adjacent the quantum dot laser structure for reducing leakage of injected electrons from the contact layer structure.

25. The method of claim 16, wherein each of the quantum dots has a base width of about 50 nm and a height of about 3 nm.

26. The method of claim 16, wherein the GaN-based quantum dot layer structure is formed of quantum dots formed in a self-organized manner.

27. The method of claim 16, wherein the GaN-based quantum dot layer structure is formed using bottom-up or top-down nano-patterning.

28. The method of claim 16, wherein the semiconductor optical waveguide is formed on the GaN template, and wherein the foreign substrate is sapphire, silicon carbon (SiC), silicon, a glass substrate, or a composition thereof.

29. The method of claim 16, wherein the formation of self-organized GaN-based quantum dots are formed using molecular beam epitaxy, metal-organic vapor phase epitaxy, atomic layer deposition, hydride vapor phase epitaxy, or a combination thereof.

30. The method of claim 16, wherein the quantum dot layer structure is configured to achieve three-dimensional quantum confinement.

31. The method of claim 16, wherein the quantum dot layer structure is configured to achieve an electron-hole overlap that is higher, by a factor of at least 2, than that of a corresponding quantum well device, a radiative lifetime that is at least an order of magnitude smaller than a corresponding quantum well device, and/or a polarization field at least one order of magnitude smaller than that of a corresponding quantum well device.

32. The laser of claim 1, wherein the quantum dot layer structure comprises a plurality of layers of InGaN/AlGaN quantum dots.

33. The laser of claim 1, wherein the quantum dot layer structure comprises a plurality of layers of InGaAlN/AlGaInN quantum dots.

* * * * *